United States Patent [19]

Sahyoun

[11] Patent Number: 5,532,649
[45] Date of Patent: Jul. 2, 1996

[54] SPEAKER RESISTANCE SENSING AND POWER LIMIT SETTING CIRCUIT

[76] Inventor: Youssef Y. Sahyoun, 436 Lanyard Ave., Redwood City, Calif. 94065

[21] Appl. No.: 368,772

[22] Filed: Jan. 3, 1995

[51] Int. Cl.⁶ .......................... H03F 21/00; H02M 3/335
[52] U.S. Cl. ................. 330/297; 363/26; 381/120
[58] Field of Search .......................... 330/127, 297; 381/28, 120, 121; 363/26

[56] References Cited

U.S. PATENT DOCUMENTS

| 5,216,379 | 6/1993 | Hamley | 330/297 |
| 5,295,058 | 3/1994 | McGreery | 363/26 |

FOREIGN PATENT DOCUMENTS

| 4107100 | 4/1992 | Japan | 381/120 |

*Primary Examiner*—Steven Mottola
*Attorney, Agent, or Firm*—Janis Biksa

[57] ABSTRACT

Pulse width modulating power supply circuitry is disclosed which manually or automatically controls the rail voltage setting of the amplifier circuitry. The maximum power rating of the amplifier will then be available to drive speakers with a pre-set impedance attached to the amplifier. A manual selection circuit provides a selector switch which places one or more resistors in parallel with a feedback resistor of a pulse width modulating controller which controls the setting of the rail voltages. In an automated mode the impedance of one of a set of speakers is measured at the time the amplifier is turned on and a resistor having a resistance appropriate to obtain maximum amplifier power output is placed in parallel with the feedback resistor in the pulse width modulating power supply controller by transformation circuitry. Light emitting diodes are wired into the resistor selection circuitry to provide an indication of circuit operation.

16 Claims, 14 Drawing Sheets

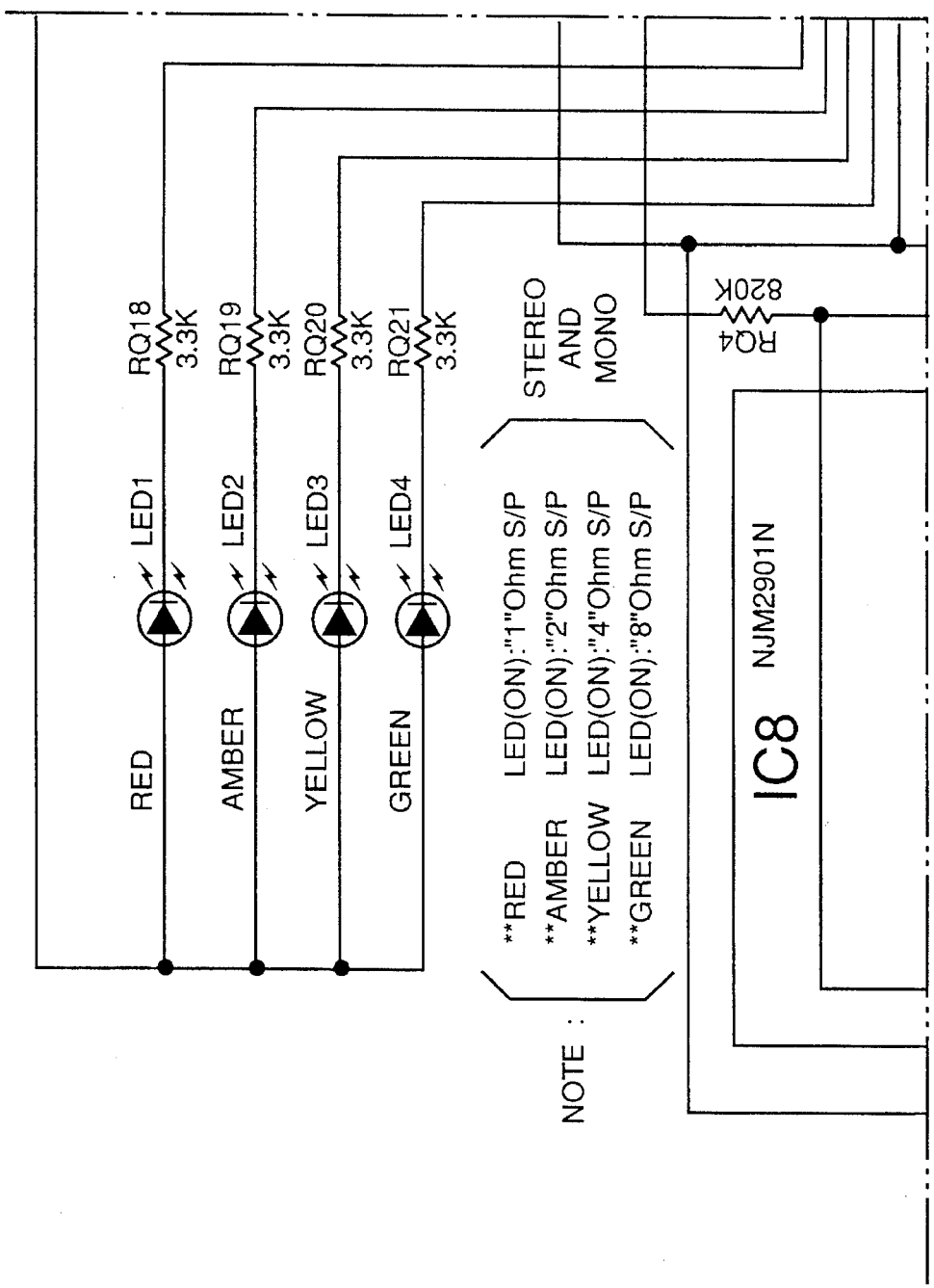

SPEAKER RESISTANCE SENSING AND POWER LIMIT SETTING CIRCUIT

FIELD OF THE INVENTION

This invention relates to the field of signal amplifiers which use pulse width modulated regulated power supplies, and in particular to circuitry used to set and control the maximum power available to amplify sound in audio systems, such as those used in motor vehicles.

BACKGROUND OF THE INVENTION

The best sound quality from a given amplifier is obtained when it is matched with the impedance of the speakers that are being driven by it. The maximum power that an amplifier can provide is dependent on the impedance of the connected speakers. Typically 8 or 4 ohm speakers are connected to the amplifier output terminals providing an output signal. The signal provided to the speakers is a voltage signal and from the equations $V=IR$ and $P=IV$ it is clear that $P=V^2/R$, i.e., power supplied by an amplifier is proportional to the inverse of the resistance (or speaker impedance) and the square of the voltage.

The maximum amplifier voltage and therefore power is limited and set by the maximum rail voltage powering the amplifier transistors. In a stereo mode one speaker (channel) is connected between positive and negative rail voltages and amplifier ground. The second speaker (channel) is connected between positive and negative rail voltages and amplifier ground, but 180° out of phase (known as a self inverting amplifier). In this configuration, the maximum theoretical power that can be supplied by either channel is the square of either rail voltage (difference between absolute value of rail voltage and amplifier ground) divided by the speaker impedance. In contrast, in a monaural configuration the maximum power available is dependent on the difference between the negative rail voltage and the positive rail voltage or twice the absolute value of the rail voltage—because of the phase inversion between the two stereo channels (less losses). For example, in a 100 watt per channel amplifier feeding a speaker having an impedance of 4 ohms under the formula $P=V_{RMS}^2/R$, the 100 watts into 4 ohms without losses provides a RMS (root mean square) rail voltage of 20 volts RMS. The 20 volts PMS translates into 28.28 volts peak to peak between either the positive rail or the negative rail and amplifier ground. In a mono configuration the potential rail voltage is doubled thereby quadrupling the potential amplifier power if rail voltage remains constant across one 4 ohm speaker.

Some amplifier users understand that reducing the impedance of the speakers attached to an amplifier according to the equation $P=V^2/R$ will enhance the power draw and thereby the volume available from an amplifier. For example if the amplifier in the example above had its output impedance reduced to 2 ohms per channel and the rail voltage was regulated to maintain the 28.28 volts peak to peak then a theoretical output of 200 watts per channel would be achieved.

Thus, when a user attaches a set of lower impedance speakers to the output of the amplifier the current draw and power increase proportionally. A 28.28 volt peak to peak rail voltage when the impedance is halved from 4 ohms to 2 ohms will theoretically double the power produced by the amplifier from 100 to 200 watts. Reducing the impedance still further to 1 ohm will quadruple the theoretical output to 400 watts. Reducing the impedance will cause the amplifier components to surge to maintain the desired rail voltage and test the limits of component capabilities. In reality transistors in the power supply will become overloaded and fail.

In an effort to prevent such overloads by users, amplifier manufacturers have tended to overprotect their amplifiers by providing components whose ratings are not exceeded when the speaker impedance is as low as 1 ohm. Again considering a theoretical case with no losses, a 100 watt per channel amplifier rated to supply 100 watts to a 1 ohm speaker impedance would have a rail voltage setting of 10 volts RMS or 14.14 volts peak to peak. If an ordinary user were to attach a 2, or 4, or 8 ohm impedance speakers to such an amplifier their maximum power output under such conditions would be 50, 25, or 12.5 watts, respectively. While this theoretically extreme scenario is often softened by utilizing components whose resistance increases with increasing temperature (such components providing additional impedance in series with the speaker when a 1 ohm impedance speaker is connected to the amplifier output) a large percentage of the amplifier capability remains unavailable if 8 ohm. speakers are connected to a circuit designed to tolerate a 1 ohm impedance at peak. In this scenario the user of 8 ohm speakers will be short changed by having only a fraction of the power available from the amplifier compared with the power available to a user using a 1 ohm impedance speaker.

This conservative design of amplifier circuitry results in underutilization of the amplifiers capabilities for most users. The rated power is available only under certain extreme conditions. The capability of that circuitry is underutilized and unaccessible in instances where high impedance speakers are used. Underutilization of amplifier capabilities is particularly noticeable in automobiles and other vehicles where a mobile power source provides power to the audio system. Users who use high impedance speakers find that they cannot seem to get the power from the speakers which match the amplifier rating.

Further, even at non-peak volume levels the dynamic headroom available to the music is limited because of the low rail voltage. When a low rail voltage is used with high impedance speakers, the peaks of the music signal which require voltage beyond the rail voltage are "clipped" by the limits of the voltage supplied (have insufficient dynamic headroom).

It would be desirable to utilize the full capabilities of an amplifier regardless of the impedance of the speakers attached to the amplifier so that full utilization of the components in the amplifier (less fixed and variable internal losses) can be made by all users.

SUMMARY OF THE INVENTION

This invention overcomes the drawback of amplifiers whose rail voltage is pre-set to accommodate low impedance speakers when using a pulse width modulated power supply. This invention does not change the power available to users who use low impedance speakers, but will increase the maximum power available to users using higher impedance speakers and provide more dynamic headroom at low volume levels so that the peaks of the music signal are not "clipped."

In a pulse width modulated power supply the length of a pulse peak in a pulse cycle is modulated by a pulse width modulation controller which adjusts the rectified DC voltage supplied to the positive and negative rails of the signal amplifier circuitry (amplifier). The pulse width modulating controller monitors the rail voltage and compares it with a reference value measured across a feedback resistor. When the reference value does not match, the width of the pulse peak (duty cycle) is increased or decreased as desired to increase or decrease the rail voltage. If the controller senses a drop in the rail voltage it will increase the pulse peak length (duty cycle) such that the pulse peak is present for, for example 60% of the time, while when the rail voltage rises to a decrease in load it will reduce its duty cycle to, for example 40%. The rail voltage is attempted to be held at the level set by the pulse width modulating controller feedback resistor. If the value of this feedback resistor is changed, the rail voltage will also change. The relationship between the rail voltage (or its derivatives) and feedback resistor values is prescribed by the attributes of the particular pulse width modulating controller circuitry used; these values are often available from the circuits manufacturer.

In one configuration according to the invention a selector switch is provided manually accessible to the user. The selector switch places resistors in parallel with the feedback resistor to change the total feedback resistance so that a higher rail voltage can be provided when a higher impedance speakers are used.

In another scenario, a circuit configured according to the invention is connected to the speaker wiring in such a way that the speaker impedance is directly measured nearly instantaneously in the dead time between when the amplifier is turned on and before its voltage stabilizing capacitors have charged or the amplifier has completed its start up (for instance, soft start) cycle.

The measurement of speaker impedance is able to take place without interfering with amplifier operations, because when the amplifier connected to speakers is turned on, measurement takes place during the first several microseconds of energization. During these first few microseconds voltage stabilizing capacitors are in the amplifier are charging, or if the amplifier has soft start circuitry, the soft start circuit is slowly bringing the power of the amplifier on line gradually. By the time the amplifier is up to full power, the speaker impedance sensing circuit according to the invention will have performed its function and set the amplifier rail voltage (and correspondingly the maximum power output) to potentially utilize the maximum capabilities of the amplifier without sacrificing the overload protection of the amplifier previously afforded by providing a low rail voltage in anticipation of a low output impedance. During this dead time the amplifier circuitry connected directly to the speakers has an unpowered impedance greater than 100 times the speaker impedance. Because the speaker impedance is usually between 1 and 8 ohms, the at least 100 times greater impedance through the unpowered amplifier has virtually no effect on the impedance being measured by the power setting circuit.

To measure and determine speaker impedance a stabilized reference voltage is provided through one of the speakers to ground while simultaneously the same reference voltage is provided through a comparison circuit which compares the voltage drop as a result of the speaker impedance with known voltage settings for 8, 4, 2 and 1 ohms, respectively. This comparison establishing a speaker impedance is made within several microseconds. A feedback resistance is then automatically selected to provide maximum rated power output for the amplifier. The engagement of the appropriate resistor(s) is accomplished through a latching circuit which prevents the chosen value from being changed and energizes a relay type integrated circuit to engage a selected one of a series of (for example four) possible power setting resistors which are wired in parallel with the feedback resistor of the pulse width modulating controller. Once the circuit is latched by the latching circuitry the power setting resistor value will remain in parallel with the feedback resistor until the amplifier is turned off and re-powered.

In those instances where a monaural (mono or single) speaker is connected across both positive leads of the two stereo channels (bridging), a circuit according to the invention provides grounding of one leg of the speaker so that measurement across the speaker to ground can take place. As the amplifier reaches the end of its dead time and fully powers up a relay opens the contact from one side of the mono speaker to ground thus restoring the speaker wiring to its normal operating mode.

By using circuitry configured according to the invention the full capabilities of the amplifier will be utilized as set by the impedance connected to the speaker terminals of the amplifier when it is turned on.

Impedance sensing can be configured so that a light emitting diode corresponding to the sensed value can be switched on simultaneously with connecting of the power setting resistors. A user can directly observe and receive feedback about what impedance the circuit according to the invention has sensed at its speaker terminals. Use of the maximum potential of the amplifier can then be assured whether it be in maximum volume or dynamic head range as required by a user.

A circuit according to the invention can be provided as an add on to an existing amplifier or can be fully integrated in assembly and construction of an OEM amplifier. In those instances where the circuit is provided as an add on, its failure or the failure to make all connections to the circuit will cause the amplifier to default to its original conservative feedback resistor setting thereby limiting the output of the amplifier by limiting the rail voltage available.

BRIEF DESCRIPTION OF THE DRAWINGS

FIGS. 4A, 4B, 4C, and 4D are four sheets of a schematic diagram showing one embodiment of a circuit according to the invention providing connections to the amplifier circuitry of FIGS. 3A–3D; and FIG. 5 shows a table providing input signal to output switching control function as provided in the coder integrated circuit IC9 in FIG. 4D.

DETAILED DESCRIPTION

Figure 1:
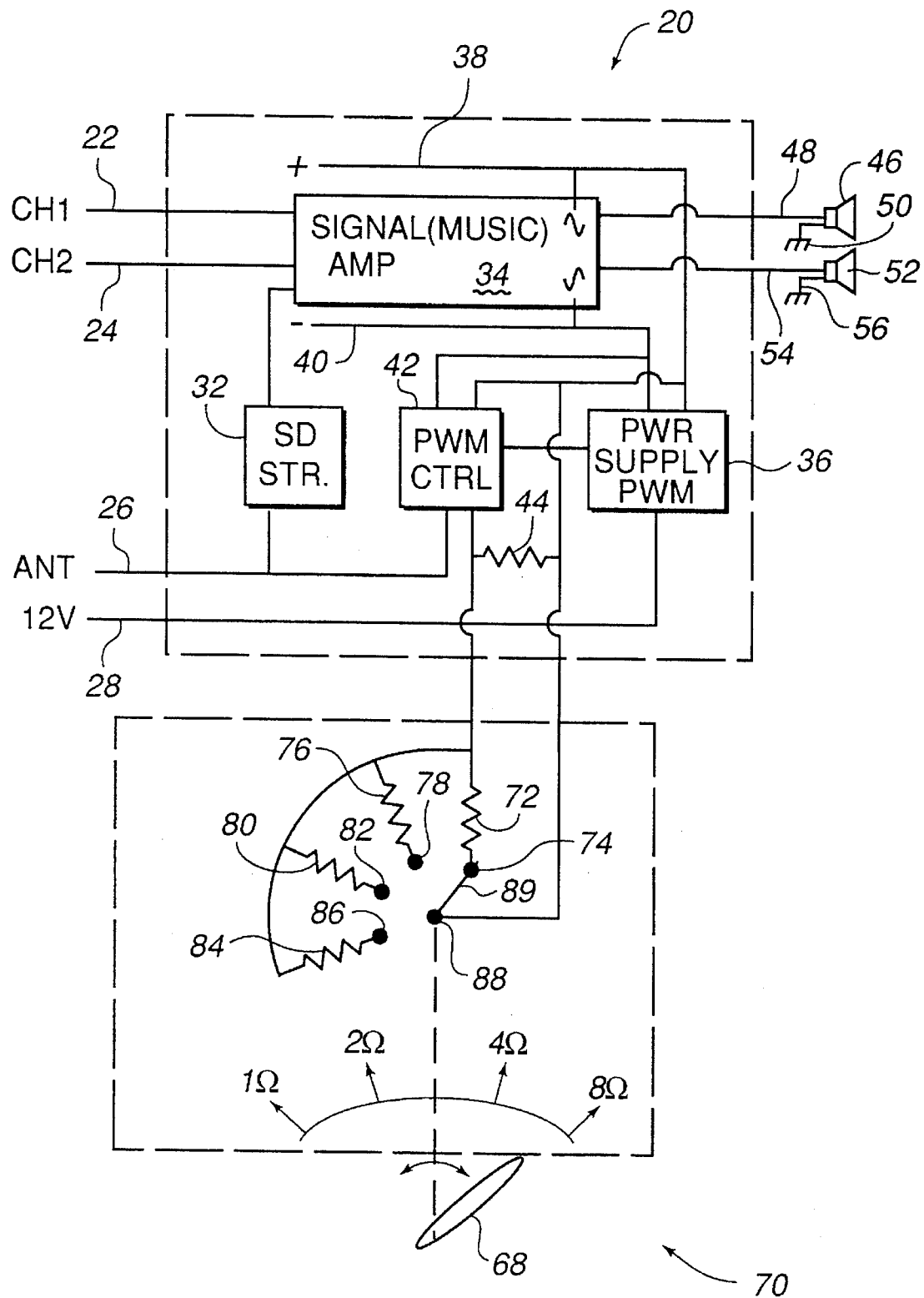
FIG. 1 is a schematic block diagram showing an example of a manual selector switch according to the invention attached to an amplifier powered by pulse width modulating power circuitry.

A circuit according to the invention as shown in FIG. 1. An amplifier 20 is provided with two signal inputs, a channel "1" signal (music) input 22 and a channel "2" signal (music) input 24. These signals go to signal (music) amplification circuitry 34 where the signals are amplified. The channel "2" signal 24 is inverted to avoid additive cancellation of the signal. Output signals are provided through output wires 48 and 54 to speakers 46 and 52 which are connected to the circuit ground by wires 50, 56.

Figure 2:
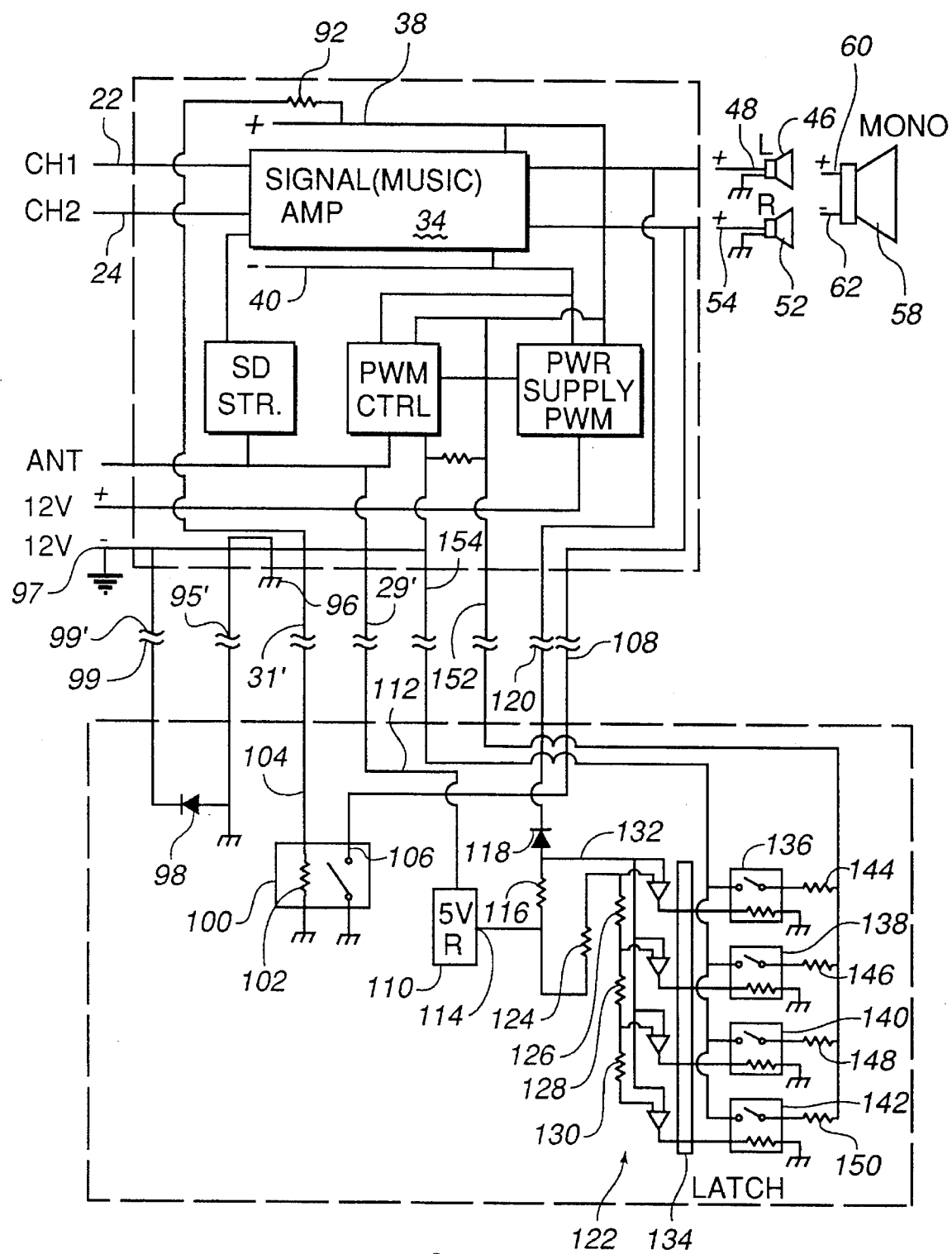
FIG. 2 is a schematic block diagram generally showing the key components of a circuit according to the invention to sense and set the rail voltage for the amplifier by controlling the pulse width modulating controller feedback resistance.

The signal amplification circuitry 34 receives its power from a positive rail 38 and a negative rail 40. The DC rail voltages provide a power source for the amplification of the music signal by the transistors (not shown) in the amplifier. The rail voltage is the maximum voltage that can be supplied to the speakers 46, 52. The maximum power available per channel in a stereo system is the difference between the absolute value of the rail voltage and circuit ground. The maximum power that the amplifier can provide per channel is the RMS (root mean square) rating of the rail voltage squared divided by the impedance of the speaker to which it is connected. This relationship is expressed by the formula $P=^2/R$ which is derived from $V=IR$ (Ohms Law) and $P=IV$. Where V is voltage, I is current and P is power. A single speaker can be connected monaurally across the speaker wires 48, 54 as shown in FIG. 2. The positive and negative leads 60, 62 of the mono speaker 58 are connected to the two positive leads of the right and left hand speakers of the signal amplification circuitry 34. The positive right hand channel is inverted from the left hand channel to prevent the signals from cancelling one another (no music would be heard). The sinusoidal wave form pictured in the box of the circuitry 34 shows an example of this inversion.

DC power to the rails 38, 40 supplying positive and negative rail voltage is originates from a pulse width modulating power supply 36. The details of the pulse width regulating power supply 36 are shown in FIGS. 3C, 3D. A 12 to 14 volt DC potential stabilized by a series of large capacitors EC305, EC306, EC307 is provided to the center tap of a toroidal transformer T1. The current flow through the upper and lower legs of the primary coils of the transformer are controlled by a series of MOSFET transistors Q310, Q311, Q311A, Q312, Q313, and Q313A. The cycling of these transistors is controlled by the pulse width modulating controller 42 as pictured in FIG. 1 and FIGS. 3F, 3H. The NPN transistors Q301 and Q302 controlled by ports "8" and "9" of IC4 the pulse width modulating controller integrated circuit 42 control the switching of the MOSFET transistors in the pulse width modulated power supply 36.

In the pulse width modulated power supply 36, the secondary coils on the toroidal transistor T1 when switched provide a square wave signal to diodes D11, D12 which rectify the positive and negative wave forms to provide only positive or negative voltage to a choke coil T2. The choke coil T2 acts as a low pass filter and stabilizes the voltage at its output which is connected to the positive and negative rails of the amplification circuitry. The positive and negative rails 38 and 40 are stabilized by large 3300 microfarad capacitors EC301, EC302 as shown in FIG. 3B. The pulse width modulating controller 42 monitors the rail voltages and adjusts the pulse width (duty) as needed to maintain the desired rail voltage. A feedback resistor 44 shown in FIG. 1 and FIG. 3D sets the voltage level at which the pulse width modulating controller 42 controls the rail voltage. The feedback resistor 44 is selected (according to manufacturer's specifications) to control the rail voltage to avoid overloading the amplifier and its power supply circuitry.

A soft start circuit 32 (FIG. 1, FIG. 3C) provides a gradual buildup of voltage in the signal music amplifier circuitry 34. While a fairly sophisticated circuit is shown in FIGS. 3E, 3G (including for example Motorola comparator LM358—"IC3") the soft start circuitry could be as simple as some large capacitors which require several milliseconds to charge. The soft start circuitry shown in FIG. 1 and FIGS. 3E,3G delays full voltage for 3 to 5 seconds and prevents any voltage shock or audible bump to the speakers at turn on. The above described circuitry with some variations is recognized as typical of the type of amplifiers which are typically used in motor vehicle audio systems powered by a 12 volt DC power supply.

One configuration according to the invention involves attaching a selector switch 70 as shown in FIG. 1 in parallel with the feedback resistor 44 (creating a feedback loop). According to the equation for resistors in parallel when the moveable contact arm 89 of the selector switch 70 changes its position to vary the resistance in parallel with the feedback resistor by connecting from the central distribution selector contact 88 to the selector contacts 74, 78, 82, and 86, respectively for 8, 4, 2, and 1 ohm speaker impedances. Resistors 72, 76, 80, and 84 when selected to be in parallel with the feedback resistor 44 are rated to change the equivalent feedback resistance so that the pulse with modulating controller 42 controls (reduces) the rail voltage according to the maximum power limits of the amplifier (including its power supply) when speaker impedances of 8, 4, 2, and 1 ohm respectively are attached. A selector switch handle 68 moves the moveable contact arm 89 pivoting on the central distribution selector contact 88 among the contacts 74, 78, 82, and 86 as appropriate.

A drawback of a manual system as described above is that some users will forget to move the selector switch when they change speakers and some will intentionally abuse the circuitry by placing the selector switch in a position appropriate for a high impedance speaker while actually attaching a low impedance speaker, thereby increasing the power draw on the amplifier and possibly overloading it.

While FIG. 1 shows individual resistors 72, 76, 80 and 84 which are not in series with one another a selector switch could be wired and resistors selected so that equivalent resistances could be provided by several resistors in series as opposed to individual resistors in parallel as shown in FIG. 1.

Another configuration of a circuit according to the invention shown in FIG. 2 involves using transformation circuitry or an IQ circuit. The IQ circuit 90 of FIG. 2 senses the speaker resistance at turn on by providing a reference voltage signal through a speaker (or a set of speakers on one channel). The power to the amplifier is controlled by an on/off switch powering the antenna wire. This circuit works within several microseconds such that there is virtually no effect from any other impedance (such as impedance through the signal amplification circuitry 34). Upon power being applied to the antenna wire 26, a wire connects to a regulated output voltage IC input terminal 112 through connectors 29 and 29'. The regulated output IC 110 provides a set voltage (for example 5 volts DC) at its output pin 114. One of the two branches is then connected to one speaker's positive lead (for example 48) through an equivalent resistor 116 and a diode 118. The voltage level between the resistor 116 and the diode 118 is connected from the diode inlet to a second leg of four sets of comparators 122. The second of the two output branches from the output pin 114 is connected through a resistor 124 to the first comparator and in series through resistor 126 to a second comparator through resistor 128 to a third comparator and through resistor 130 to a fourth comparator. These comparators compare the voltage level established by the speakers with known voltage levels for 8, 4, 2, and 1 ohm impedances. When the voltage level on the speaker side is greater than the voltage level based on the preset selected known values, one or more comparators will provide an output signal through a latch 134 which then latches the condition of that output data signal preventing recognition of subsequent data signals. Signals from the latching function power a relay or relay type integrated circuit 136, 138, 140, or 142, the coil (or equivalent) of one of which is energized and encloses contacts in the relay to connect resistors 144, 146, 148, 150 in parallel with the feedback resistor 44 which controls the rail voltage provided to the signal amplification circuitry 34.

The resistance of only one speaker (in the example shown the left speaker) is measured as it is unusual to attach unmatched speakers to an amplifier. The impedance of the one speaker is thereby measured between its positive lead and the circuit (system) ground. In the instance where a monaural speaker is used, the negative lead 62 of the monaural speaker is connected to the terminal which corresponds in a stereo mode to the right hand channel positive, thereby providing maximum amplitude between two extreme rail voltages. However for impedance measuring purposes this lead is temporarily grounded through a relay 100 so that the measurement across the speaker impedance between leads 60 and 62 can take place according to the standard IQ circuit operation.

The circuit ground is not necessarily the battery ground but is the ground potential established between the two rail voltages.

Figure 4B:
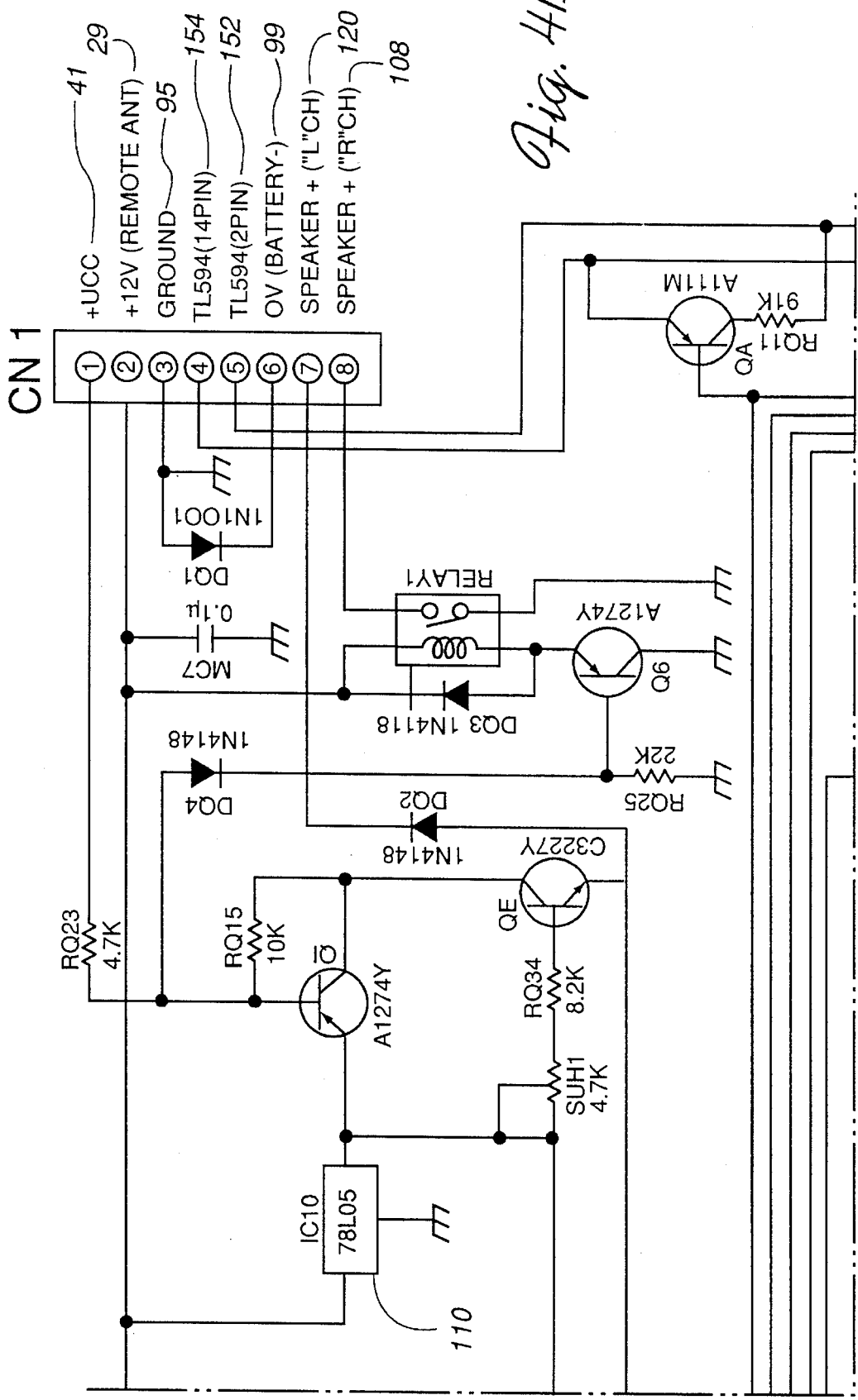

When the start dead time has expired and the signal amplification circuitry 34 reaches its normal energized level, the diode 118 as shown in FIG. 2 as well as a cascade of transistors QI, QE, QG as shown in FIG. 4B are configured to open the circuit when the signal amplification circuitry 34 is energized providing power to the IQ circuit 90 through wire 104.

While only four discrete steps are shown for expected impedances of 8, 4, 2 and 1 ohms, respectively, a greater number of steps could be utilized as desired to more precisely set the rail voltage to maximize amplifier performance while preventing its overload.

Figure 3:
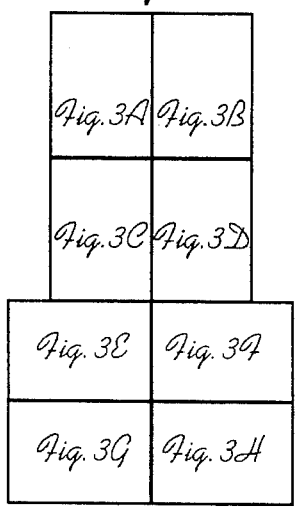
FIG. 3 is a legend of the arrangement of FIGS. 3H–3H.
Figure 3A:
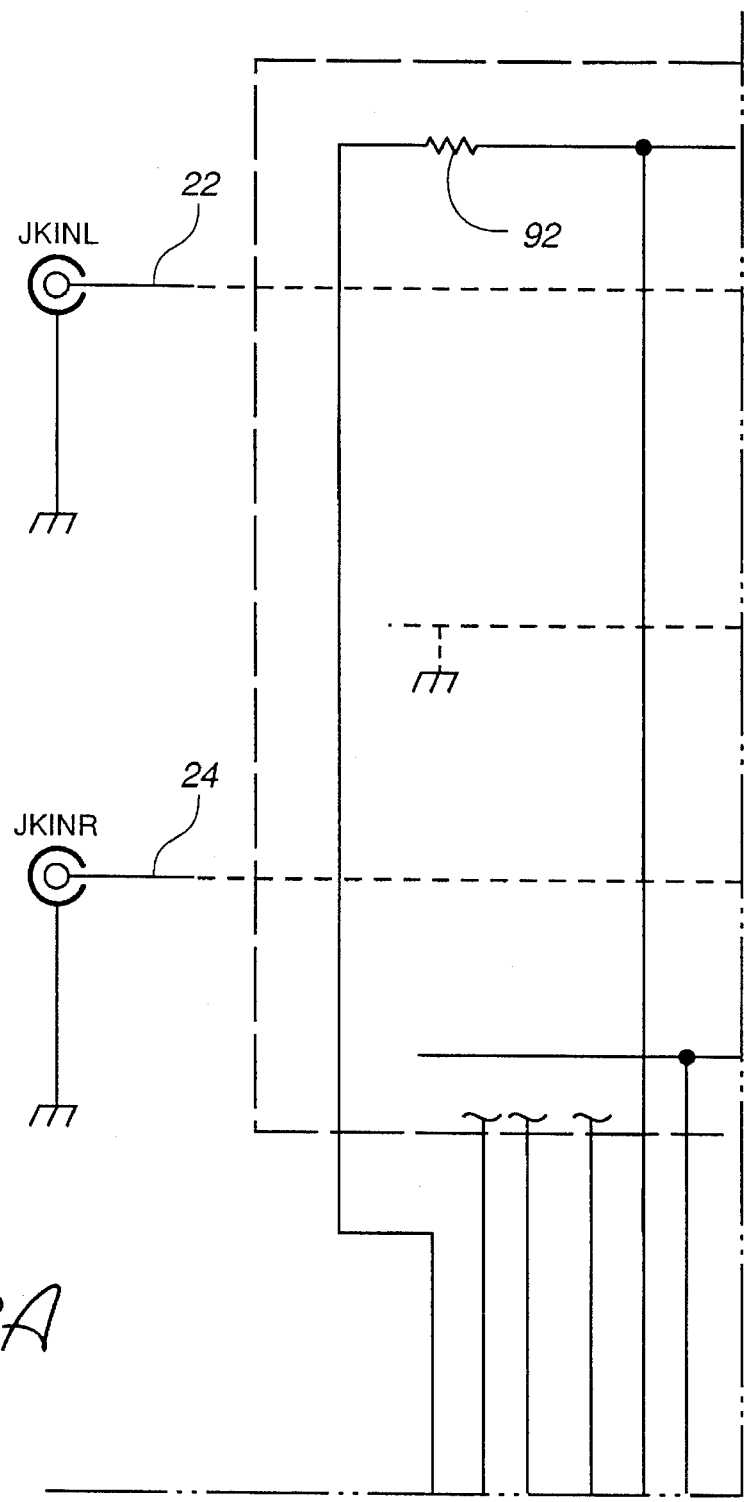
FIGS. 3A, 3B, 3C, and 3D, 3E, 3F, 3G, and 3H are eight sheets of a schematic diagram generally showing the details of a audio amplifier powered by a pulse width modulating power supply controlled by a pulse width modulating controller having a soft start circuit with connectors to a resistance sensing and power setting circuit according to the invention; Figure Four is a legend of the arrangement of FIGS. 4A–4D.
Figure 3B:
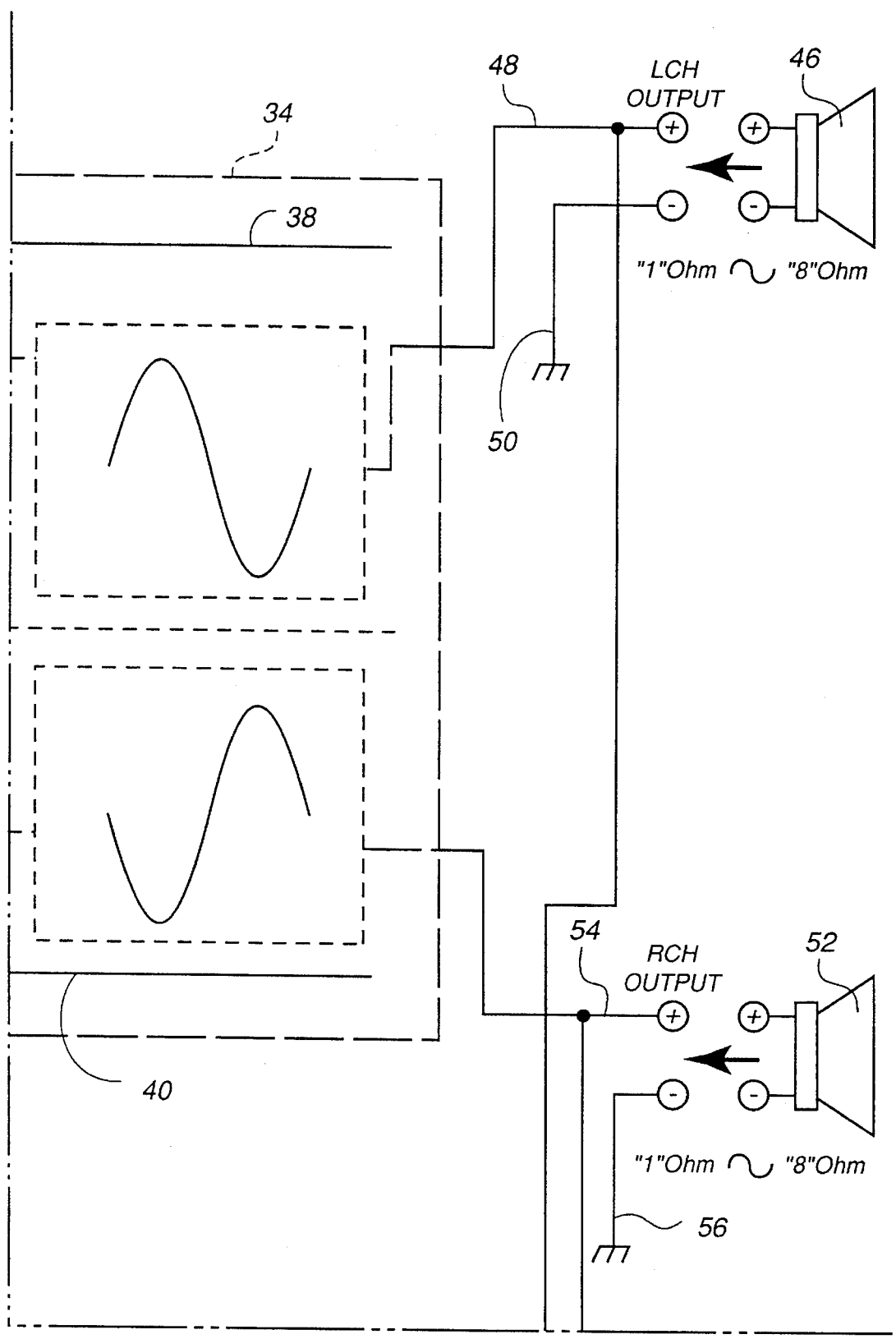
Figure 3C:
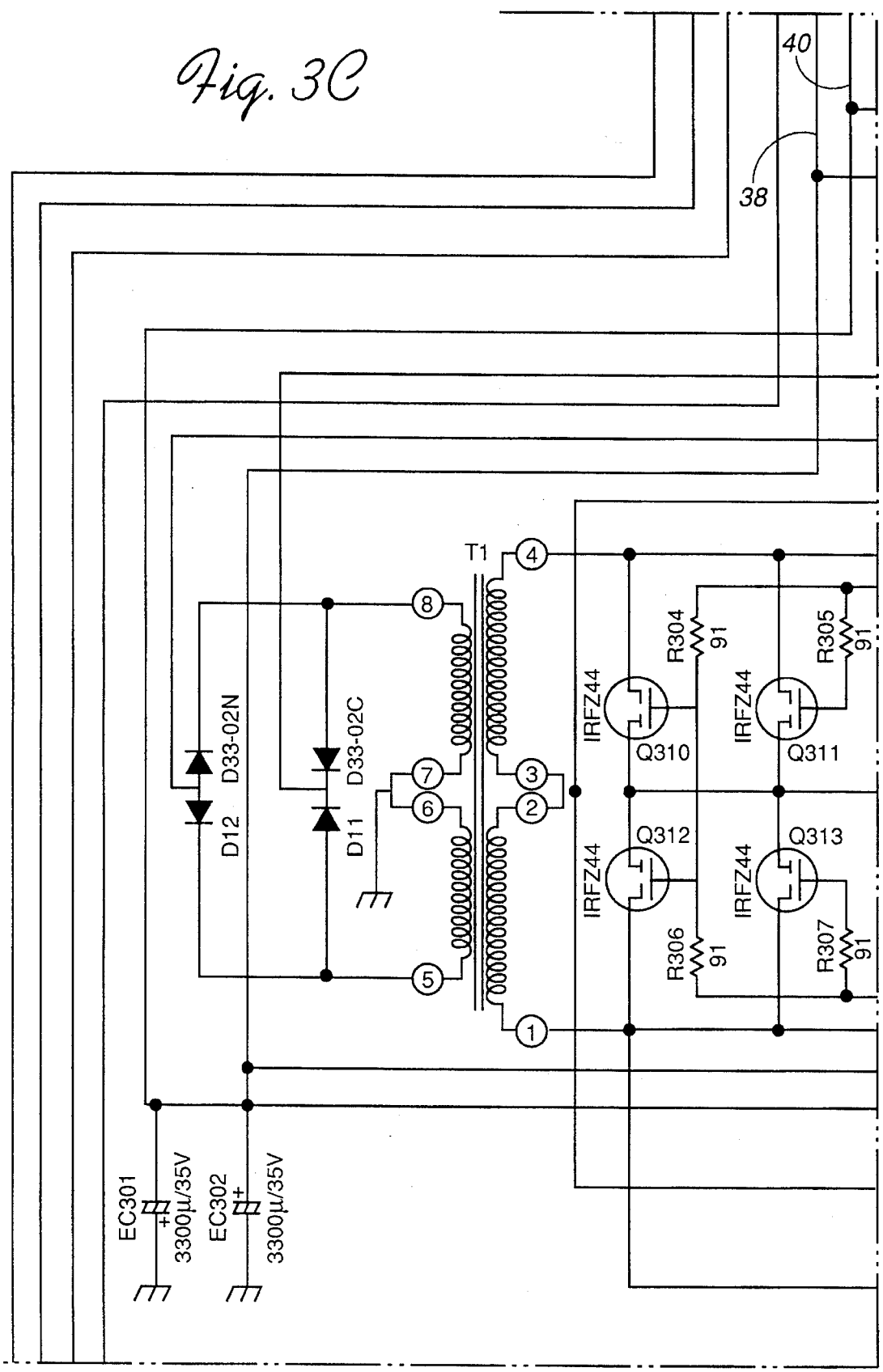
Figure 3D:
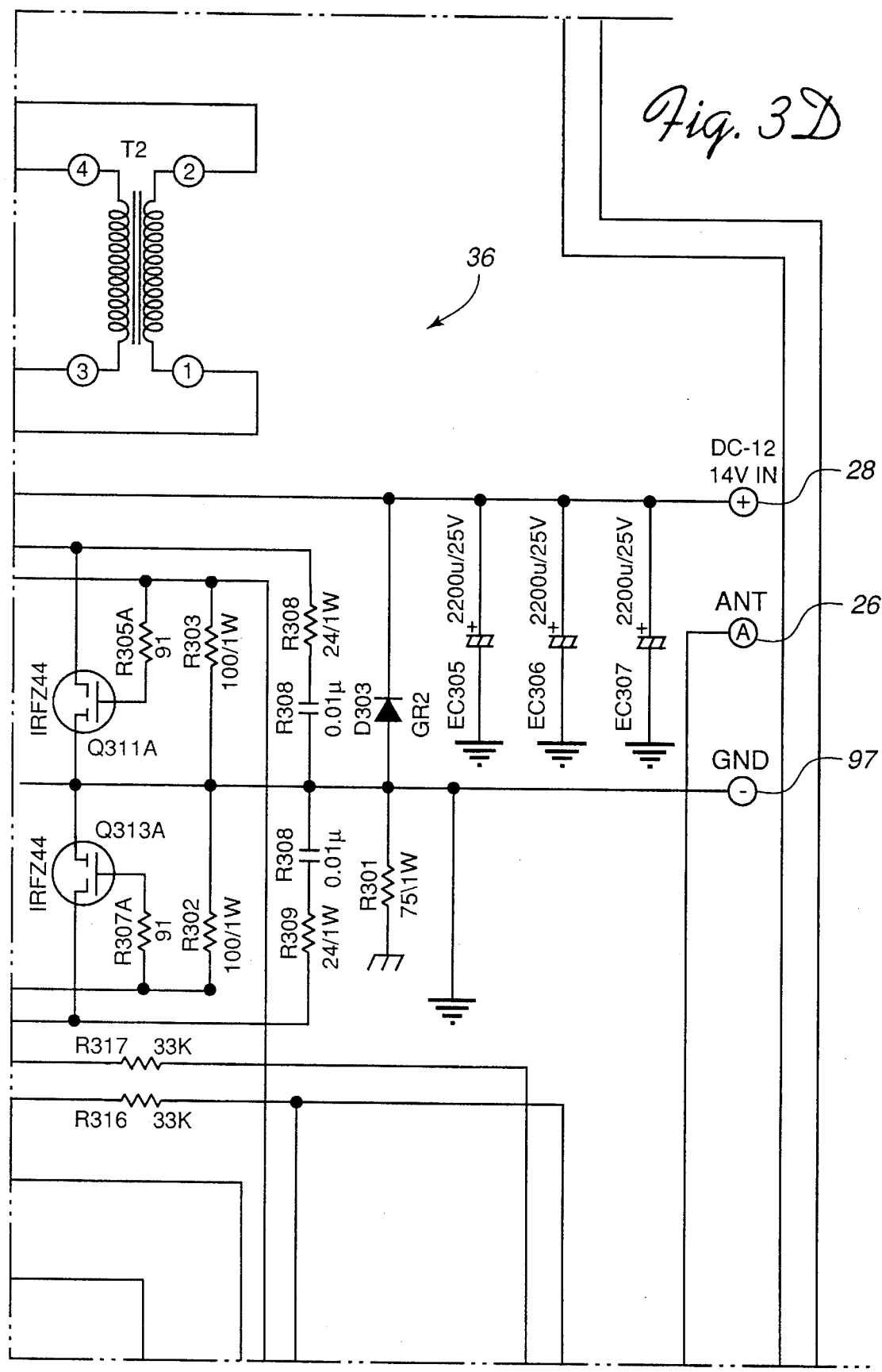
Figure 3E:
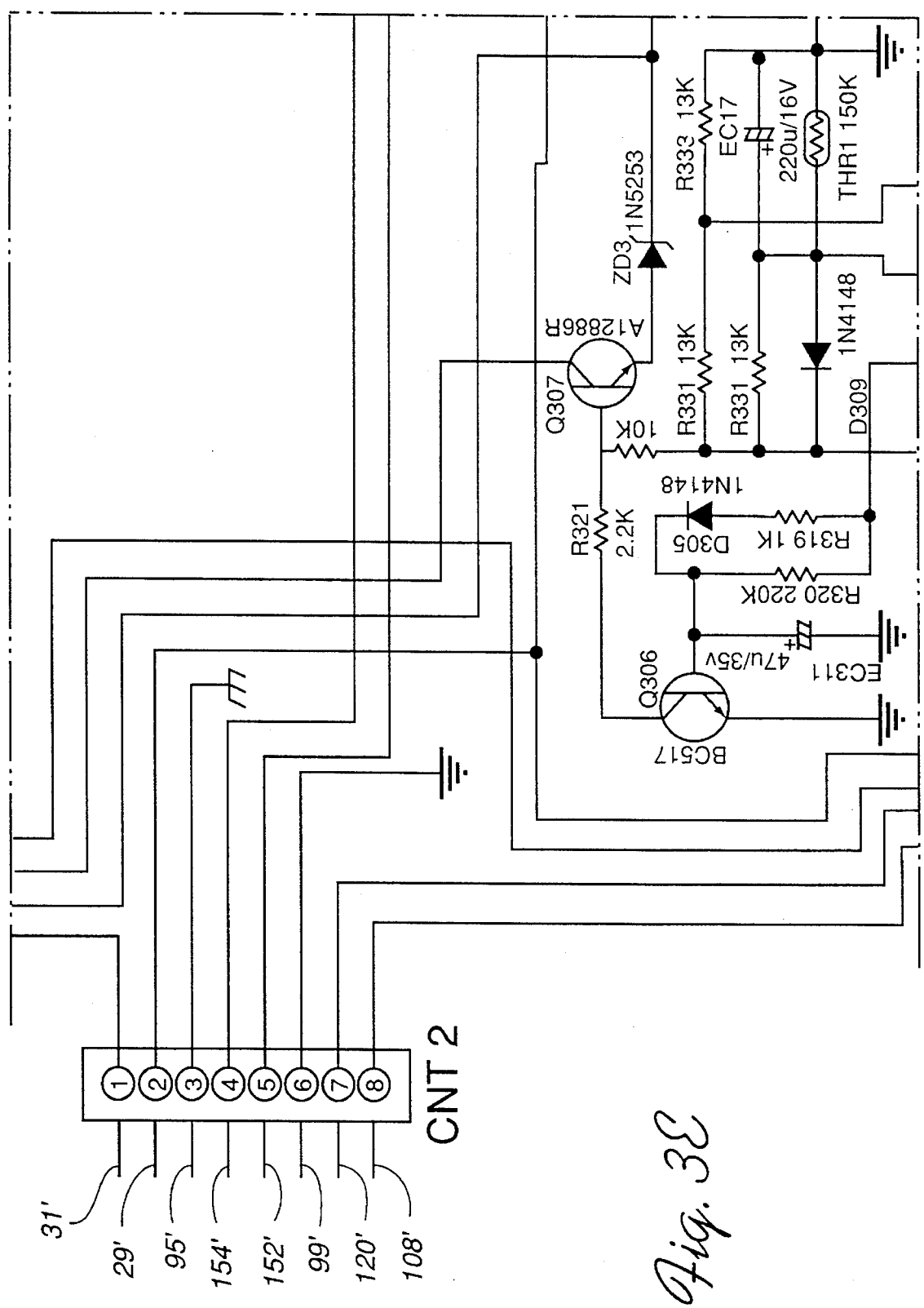
Figure 3Q:
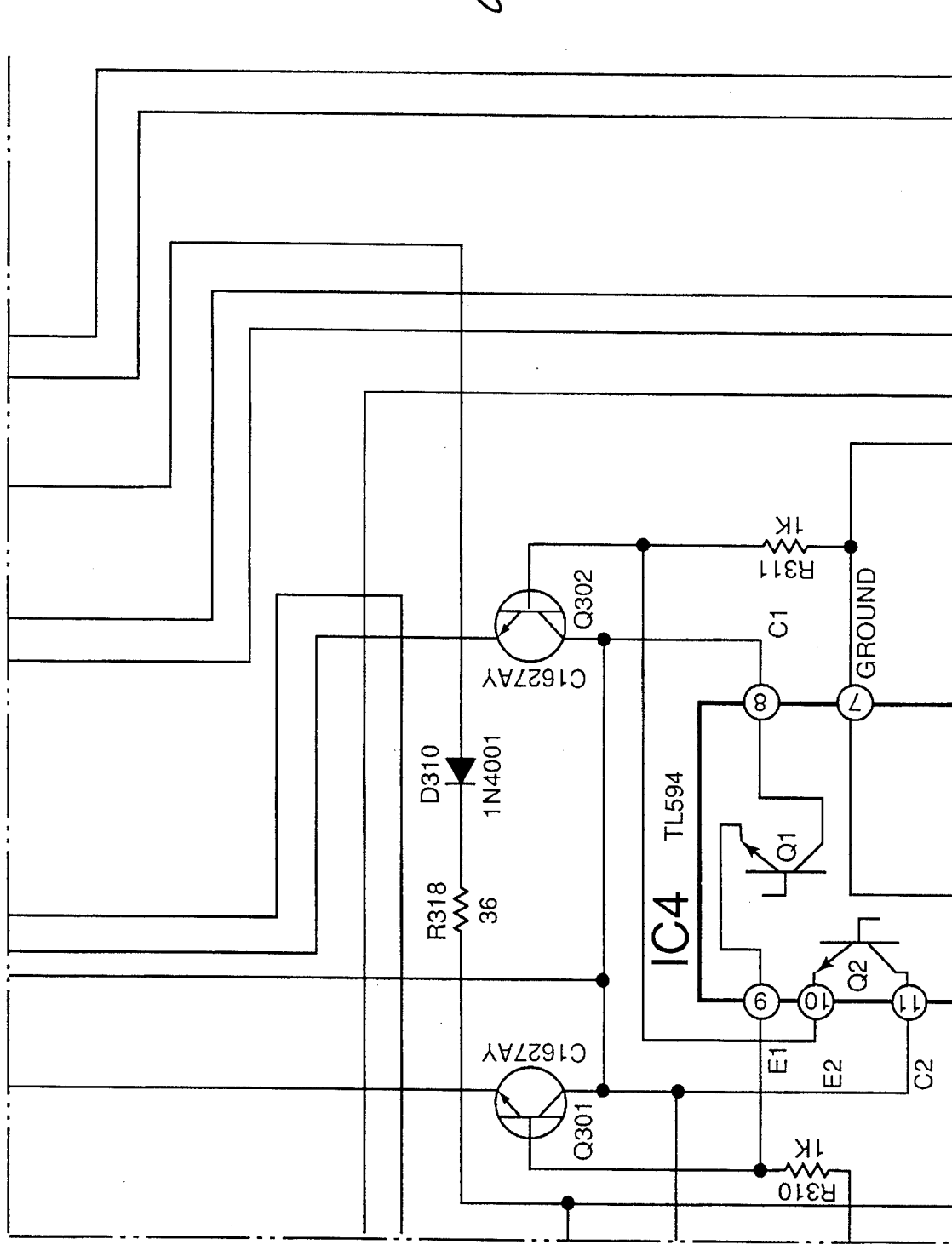
Figure 3G:
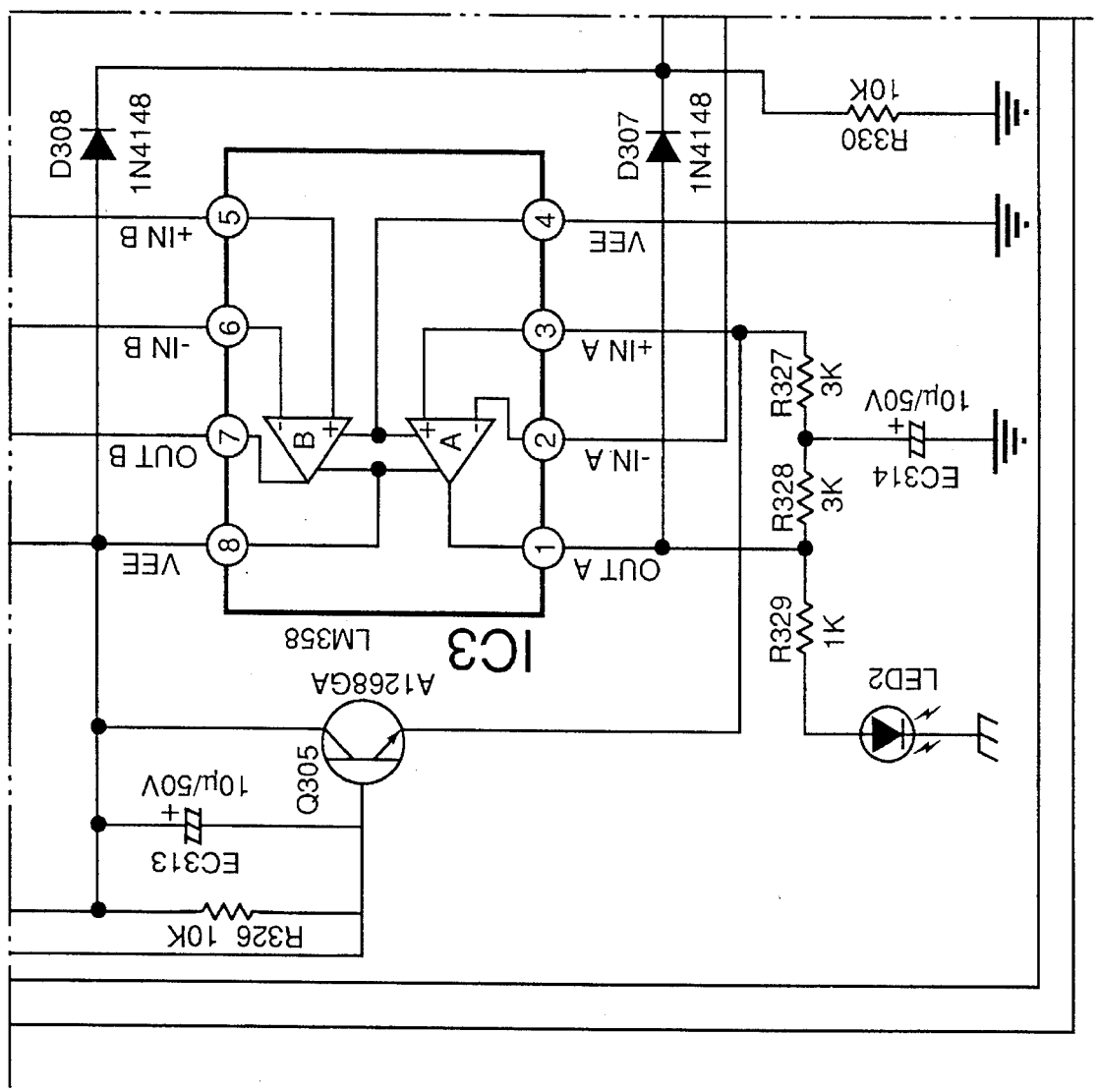
Figure 3H:
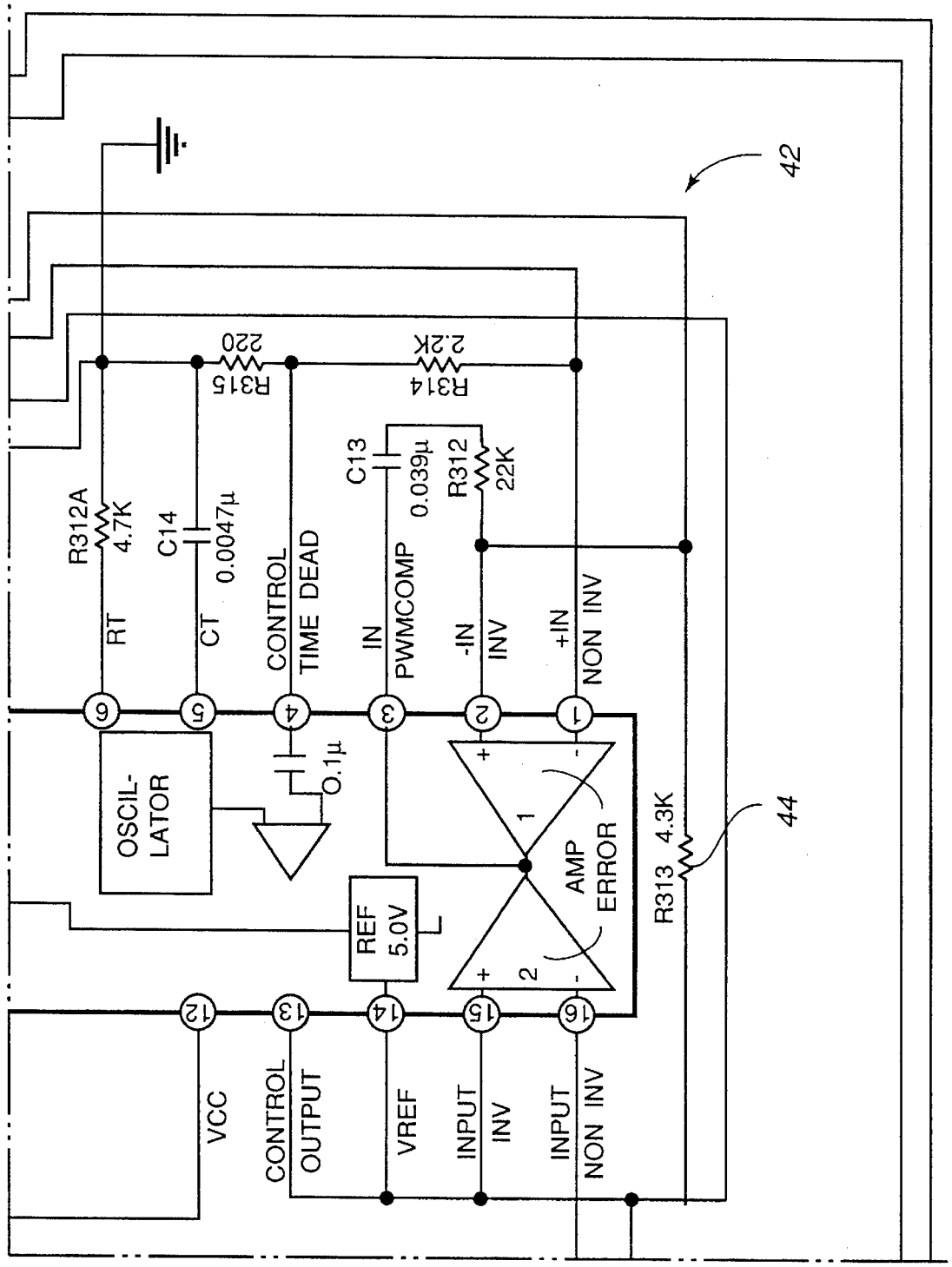

FIGS. 3A, 3B, 3C, and 3D, 3E, 3F, 3G and 3H when assembled as shown by the legend in FIG. 3A, show generally the schematic diagram of pulse width modulating power supply circuitry as applied to signal amplification circuitry 34 (which is not shown in detail). The setting of the positive and negative rail voltages on the positive and negative rails 38 and 40 is as previously discussed. The pulse width modulating controller 42, the pulse width modulating power supply 36, and the soft start circuitry 32 is shown connecting through a connector CNT2 to the IQ circuit 90 whose schematic is shown in FIGS. 4A, 4B, 4C and 4D. The pulse width modulating controller IC4 pictured in FIGS. 3F, 3H is for example a TL594 Motorola item, pulse width modulating controller, although similar controllers can also be used. The feedback resistor 44 (also labeled R313) is 4.3 kilo ohm resistor. This feedback resistance alone provides a rail voltage output setting of 25 volts RMS positive and negative. The connector CNT2 includes connector pins 31', 29', 95', 154', 152', 99', 120' and 108' which corresponds to the similar pins in the IQ circuit connector CN1 pictured FIGS. 4B, 4D.

Figures 4C, 5:
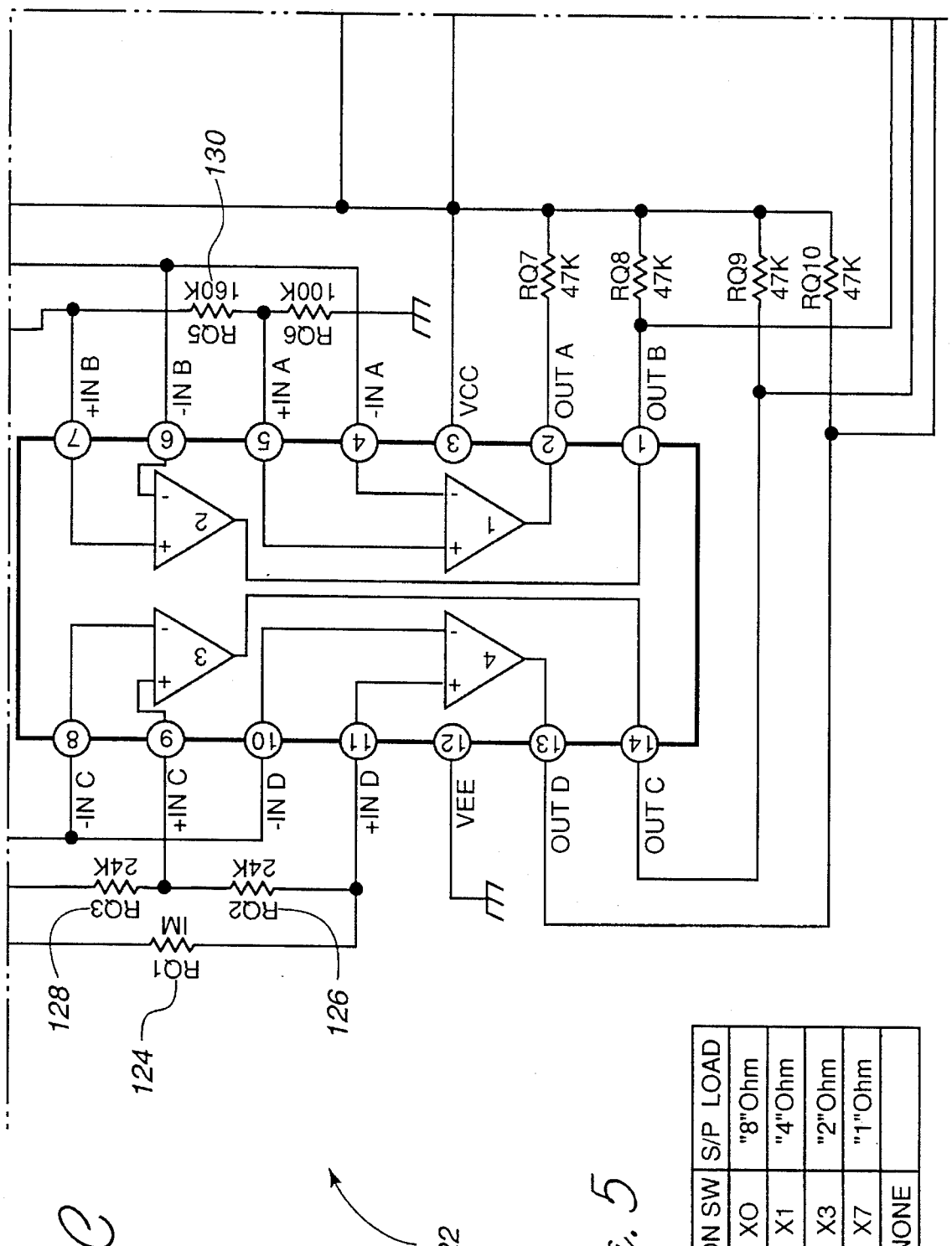
Figure 4D:
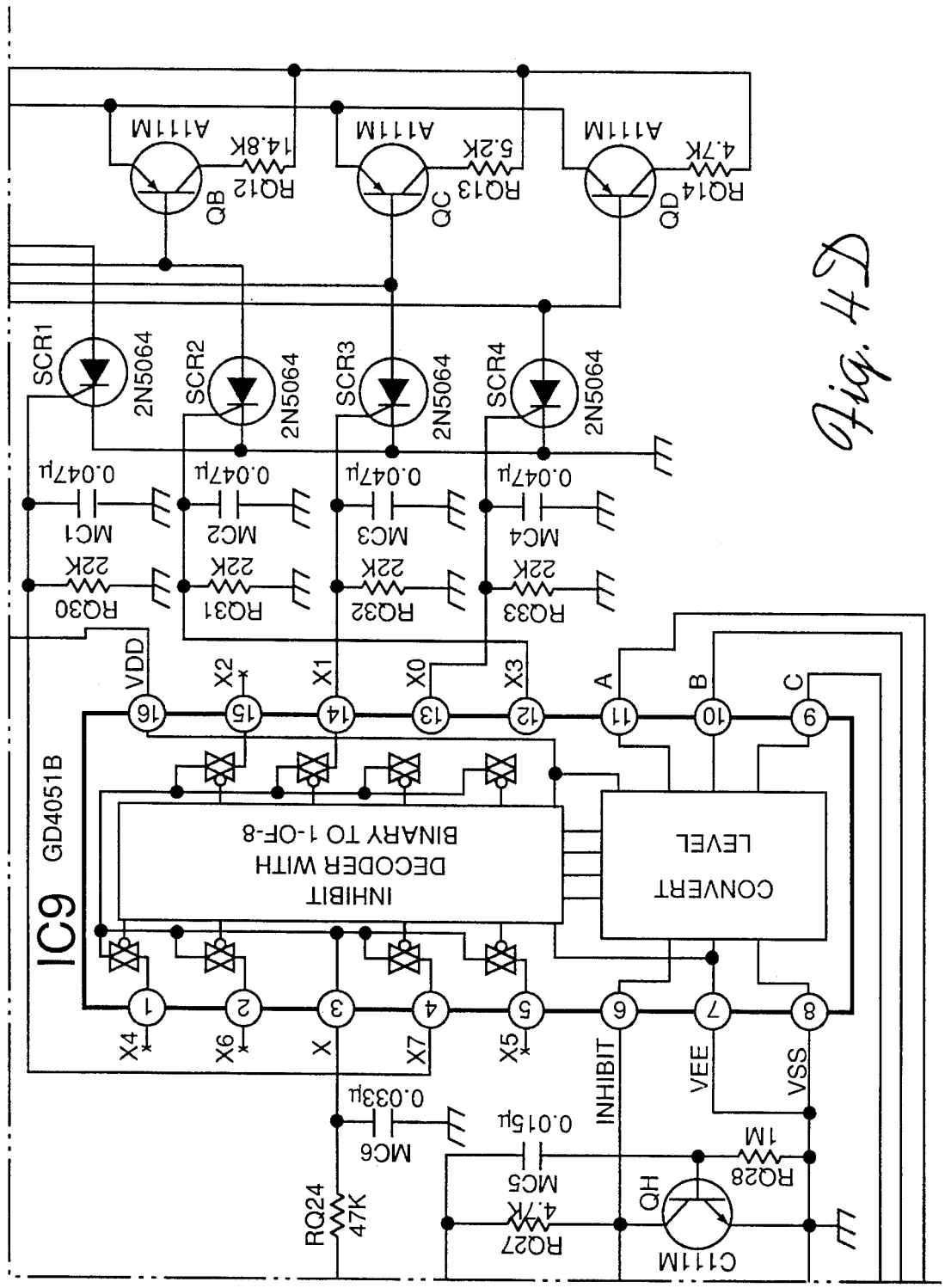

IQ circuit operation (FIGS. 4A–4D) is as follows. Upon energization the pin "2" (also labeled 29) powered by the antenna wire 26 (FIG. 3D) 12 volt DC power is provided to IC10 which is a 5 volt regulating power chip (for example by Motorola or Texas Instruments No. 78L05.) This in turn provides its output in two branches. One branch goes through a variable resistor SUH1 of 4.7K max. value in series with a fixed resistor RQ34 of 8.2K value through a transistor QE to feed through a diode DQ2 and the positive lead 48 of the left hand speaker as shown in FIGS. 3A, 3B. The same branch also feeds through a resistor RQ4 having a 820K value and feeds into the second input of the four comparators in the comparator integrated circuit IC8 (for example by Motorola NJM2901N.) The second branch of the regulated power supply IC10 output, powers the comparator IC IC8 through its VCC port "3" and also is routed through several resistors which cascade in series to the four comparators 122. The first resistor 124 (RQ1) a 1M value which reduces the voltage for comparison into the first comparator providing a high signal at "out D" (at port "13") as shown in FIGS. 4B, 4C. The second resistor 126 (RQ2) provides an additional resistance of 24K into the third comparator through port "9" and provides an output through port "14" having an "out C". The third resistor 128 (RQ3) has a value of 24K and provides an input to comparator "2" through port "7". The fourth resistor 130 (RQ5) has a value of 160K and provides an input to comparator "1" having an output through port "2" and "out A". The final resistor RQ6 has a 100K value connected to circuit ground potential. The comparators "1", "2", "3", and "4" in the comparator IC8 provide an output only when the positive input is greater than the negative input.

The operation of the circuit is as follows. The regulated 5 volt voltage of IC10 will provide DC current of about 5 milliamps from the emitter of the transistor QE to the diode DQ2 and through the positive speaker terminal to ground. Under this scenario the DC voltage between the emitter of QE and ground has empirically determined to be 0.05 volts for a 1 ohm speaker load, 0.09 volts for a 2 ohm speaker load; 0.19 volts for a 4 ohm speaker load; and 0.37 volts for an 8 ohm speaker load. These voltage levels will be detected in the comparator integrated circuit IC8 as follows. An 8 ohm load will energize pin "2" and "out A" will go high (essentially a dead end, having no effect). At a 4 ohm load pin "13" is energized. At a 2 ohm load pins "13" and "14" are energized and with a 1 ohm load pins "13", "14" and "1" are energized The resistor values 124, 126, 128 and 130 being 1 mega ohm, 24 kilo ohms, 24 kilo ohms, 160 kilo ohms respectively are also affected by impedance and losses through the transistors of ICS. These values have been set by empirical studies as opposed to theoretical calculations (resistor RQ6 having a value of 100 kilo ohms provides stability to the voltage dividing resistors in series.)

With respect to the impedance sensing by voltage through the first branch from the voltage regulating IC10 the variable resistor SUH1 rated at 4.7K max. provides the capability of adjusting the circuit to allow for manufacturing tolerances and variances in components of the circuit.

The outputs from pins "1", "13", and "14" of IC8 are routed to "A", "B" and "C", inputs of an integrated circuit inhibit decoder IC9 (for example by Gold Star GDH051B) which switches on its output "X0", "X1", "X3" and "X7" in response to signals provided to inputs "A", "B", and "C" When there are no inputs in "A", "B", and "C" as can be seen in Table of FIG. 5, the "inhibit" input to the convert level operates according to the Table. The "inhibit" input initially provides a reset of the switching and as the capacitor MC5 charges the "inhibit" input is turned to ground potential through the transistor QH such that the inputs "A", "B", and "C" are then evaluated in and external switches outputs "X0", "X1", "X3" and "X7" are selectively activated to switch the SCR1, SCR2, SCR3 or, SCR4 on to exclusively provide selection of one of the resistors RQ11, RQ12, RQ13 or RQ14 (144, 146, 148, 150 of FIG. 2) (having values of 91K, 14.8K, 5.2K, and 4.7K, respectively, providing for example rail voltages of 28.69 V for 2 ohm speakers, 34.75V for 4 ohm speakers and 36 V for 8 ohm speakers) to be placed in parallel with the feedback resistor 44 of the pulse width modulating controller.

At the same time as the SCR's diodes are switched, light emitting diodes (LED) are connected to become energized as their respective transistor and resistance value is selected. LED1 is red colored and energizes when a 1 ohm impedance is sensed, an amber LED2 energizes when a 2 ohm resistance is sensed, a yellow LED LED3 energizes when a 4 ohm resistance is sensed and green LED LED4 energizes when an 8 ohm resistance is sensed.

The grounding of the speaker right channel through port "8" of the connector CN1 is performed by a relay ("relay1") which is a normally open circuit which initially closes when the remote antenna lead pin "2" (29) is turned on-and then as the VCC voltage in the amplifier circuitry 34 is reached that voltage switches the transistor QG off thereby de-energizing the coil of "relay1" and opening the contacts therein.

While certain resistances have been mentioned in the specification and are shown in the drawing these resistances can be changed and modified as long as the balancing nature of the voltage dividers associated with empirical measurements is maintained.

The operation of the IQ circuit is such that as soon as the amplifier is turned on the impedance of one speaker is sensed through the Comparator circuitry 122 and that comparison is switched and latched in the IC9. The latching circuitry of IC9 as utilized in this embodiment allows only one output to be switched on at a time. For the circuit to be reset, the amplifier must be turned off and again turned on so that evaluation of the speaker impedance can again take place.

While the invention has been described with regards to specific embodiments, those skilled in the art will recognize that changes can be made in form and detail without departing from the spirit and scope of the invention.

I claim:

1. An amplifier comprising:
   a pulse width modulating controller whose pulse control controls a rail voltage of the amplifier based on a resistance value of a feedback loop connected between two terminals of the controller; and
   a multi-position switch connected to said feedback loop such that varying the position of the multi-position switch changes the resistance value of the feedback loop to change the voltage level at which the rail voltage is controlled,
   wherein one or more positions of the multi-position switch change the resistance value of the feedback loop to control the rail voltage of the amplifier to one or more pre-set values, wherein said one or more pre-set values are set to correlate to drive speakers having one or more impedance values, wherein setting the position of the multi-position switch to a first position identified with a first speaker impedance value provides a first resistance value of the feedback loop and a corresponding pre-set rail voltage value, while moving the multi-position selector switch to a second position identified with a second speaker impedance value having higher impedance value than the first impedance value provides a second resistance value of the feedback loop and a corresponding second pre-set rail voltage value which is higher than said rail voltage value at said first position.

2. An amplifier as in claim 1, wherein said multi-position switch is a manual switch.

3. An amplifier as in claim 1, wherein said multi-position switch is a set of contacts, one or more of which are electronically activated according to an input signal.

4. An amplifier as in claim 3, wherein said input signal is provided by a circuit that configures the input signal according to the impedance of a speaker attached to the amplifier.

5. An amplifier as in claim 4, wherein said circuit that configures the input signal includes connections to the speaker and transformation circuitry configured to measure the speaker impedance and to configure the input signal according to the measured speaker impedance.

6. An amplifier as in claim 5, wherein said transformation circuitry provides a regulated voltage signal to the speaker and compares the voltage drop across a speaker to voltage drops across known resistors and generates said input signal.

7. An amplifier as in claim 6, wherein said measurement takes place before the amplifier is fully energized.

8. An amplifier as in claim 7, wherein a negative lead of said speaker is grounded by said transformation circuitry before said amplifier is fully energized and returns to normal operation when said negative lead is not grounded by said transformation circuitry.

9. A circuit connected to an amplifier using a pulse width modulating controller whose pulse control controls a rail voltage of the amplifier based on a resistance value of a feedback loop connected between two terminals of the controller, comprising:
   a multi-position switch connected to said feedback loop such that varying the position of the multi-position switch changes the resistance value of the feedback loop to change the voltage level at which the rail voltage is controlled,
   wherein one or more positions of the multi-position switch change the resistance value of the feedback loop to control the rail voltage of the amplifier to one or more pre-set values, wherein said one or more pre-set values are set to correlate to drive speakers having one or more impedance values, wherein setting the position of the multi-position switch to a first position identified with a first speaker impedance value provides a first resistance value of the feedback loop and a corresponding pre-set rail voltage value, while moving the multi-position selector switch to a second position identified with a second speaker impedance value having higher impedance value than the first impedance value provides a second resistance value of the feedback loop and a corresponding second pre-set rail voltage value which is higher than said rail voltage value at said first position.

10. A circuit as in claim 9, wherein said multi-position switch is a manual switch.

11. A circuit as in claim 9, wherein said multi-position switch is a set of contacts, one or more of which are electronically activated according to an input signal.

12. A circuit as in claim 11, wherein said input signal is provided by a circuit that configures the input signal according to the impedance of a speaker attached to the amplifier.

13. A circuit as in claim 12, wherein said circuit that configures the input signal includes connections to the speaker and transformation circuitry configured to measure the speaker impedance and to configure the input signal according to the measured speaker impedance.

14. A circuit as in claim 13, wherein said transformation circuitry provides a regulated voltage signal to the speaker and compares the voltage drop across a speaker to voltage drops across known resistors and generates said input signal.

15. A circuit as in claim 14, wherein said measurement takes place before the amplifier is fully energized.

16. A circuit as in claim 15, wherein a negative lead of said speaker is grounded by said transformation circuitry before said amplifier is fully energized and returns to normal operation when said negative lead is not grounded by said transformation circuitry.

* * * * *